United States Patent [19]
Akahane
[11] 4,159,622
[45] Jul. 3, 1979

[54] ELECTRONIC TIMEPIECE HAVING A MAIN OSCILLATOR CIRCUITRY AND SECONDARY OSCILLATOR CIRCUITRY

[75] Inventor: Yoshikazu Akahane, Suwa, Japan
[73] Assignee: Kabushiki Kaisha Suwa Seikosha, Tokyo, Japan

[21] Appl. No.: 811,808
[22] Filed: Jun. 30, 1977

[30] Foreign Application Priority Data

Jun. 30, 1976 [JP] Japan ........................ 51/77579
Jul. 8, 1976 [JP] Japan ........................ 51/81357

[51] Int. Cl.2 ..................... G01R 21/12; G04C 3/00; H03B 3/04
[52] U.S. Cl. ............................ 58/23 AC; 58/23 R; 324/82; 324/83 D; 331/176
[58] Field of Search ............... 58/23 R, 23 AC, 24 R, 58/25, 26 R, 50 R, 85.5; 324/82, 83 R, 83 D; 331/176

[56] References Cited

U.S. PATENT DOCUMENTS

| | | | |
|---|---|---|---|
| 3,451,210 | 6/1969 | Helterline, Jr. et al. | 58/26 R |
| 3,508,391 | 4/1970 | Lee | 58/26 R X |
| 3,881,310 | 5/1975 | Gerum et al. | 58/23 AC X |
| 3,938,316 | 2/1976 | Morokawa et al. | 58/23 R |
| 3,978,650 | 9/1976 | Hashimoto et al. | 58/23 AC |
| 3,999,370 | 12/1976 | Morokawa et al. | 58/23 R |
| 4,023,344 | 5/1977 | Mukaiyama | 58/23 R X |
| 4,068,462 | 1/1978 | Duff et al. | 58/23 AC |

FOREIGN PATENT DOCUMENTS

| | | | |
|---|---|---|---|
| 2250389 | 4/1973 | Fed. Rep. of Germany | 58/23 R |
| 2508915 | 9/1975 | Fed. Rep. of Germany | 58/23 R |
| 573625 | 3/1976 | Switzerland | 58/23 R |
| 581348 | 10/1976 | Switzerland | 58/23 R |

*Primary Examiner*—Stanley J. Witkowski
*Attorney, Agent, or Firm*—Blum, Moscovitz, Friedman & Kaplan

[57] ABSTRACT

An electronic timepiece having a main oscillator circuit and also having a secondary oscillator circuit for reducing the effect therefore of temperature on the accuracy of the timepiece is provided. The main oscillator circuit includes a first time standard and produces a high frequency time standard signal having a first frequency rate that is determined at least in part by the temperature characteristic of the first time standard. The secondary oscillator circuit includes a second time standard and produces second high frequency time standard signals having a second predetermined frequency determined at least in part by the temperature characteristic of the second time standard. Phase detection circuitry is provided for producing a phase detection signal in response to detecting a predetermined frequency difference in phase between the first and second high frequency time standard signals. A display is provided for displaying actual time in response to receiving a low frequency time signal produced by divider circuitry. A frequency adjustment circuit is coupled intermediate the phase detection circuitry and the divider circuitry for adjusting the frequency of the low frequency time signal produced by the divider circuitry in response to the phase detection signal being applied thereto.

21 Claims, 6 Drawing Figures

ELECTRONIC TIMEPIECE HAVING A MAIN OSCILLATOR CIRCUITRY AND SECONDARY OSCILLATOR CIRCUITRY

BACKGROUND OF THE INVENTION

This invention is directed to an electronic timepiece having a main oscillator circuit and a secondary oscillator circuit, and in particular to electronic timepiece circuitry for measuring a phase difference between high frequency time standard signals, produced by respective first and second oscillator circuits caused, at least in part, by temperature characteristics of the time standard utilized in the respective oscillator circuits, and for utilizing the phase difference to adjust the frequency rate of the timekeeping circuitry.

One problem that insures to electronic timepieces utilizing a piezoelectric vibrator as a time standard is the variation in the frequency rate of the vibrator casued by the temperature characteristics thereof. Although oscillator circuits have been provided with capacitors, having a temperature characteristic similar to that of the piezoelectric vibrator, at best, such capacitors can only approximate the temperature characteristic of the quartz crystal vibrator and, hence, cannot completely compensate therefor. Even though piezoelectric vibrators, capable of vibrating at very high frequencies, such as in the mega-Hertz range, vary little in response to temperature changes, these high frequency vibrators have been found to be less than completely satisfactory in electronic timepieces. Specifically, such high frequency piezoelectric vibrators are extremely large, thereby rendering it different to miniaturize the electronic timepiece. Secondly, by providing a time standard signal in the mega-Hertz range, the timekeeping circuitry is required to operate at higher switching speeds, thereby consuming an excess of power, and hence shortening the life of the battery utilized to power the electronic wristwatch. Accordingly, a small size electronic wristwatch, having first and second piezoelectric vibrator time standards for reducing variations in the timing rate caused by the temperature characteristics of the respective time standards, is desired.

SUMMARY OF THE INVENTION

Generally speaking, in accordance with the instant invention, an electronic timepiece having a main oscillator circuit including a first time standard and a secondary oscillator circuit having a second time standard is provided. The main oscillator circuitry is adapted to produce a first high frequency time standard signal having a first predetermined frequency rate determined, at least in part, by the temperature characteristic of the first time standard. A secondary oscillator circuit is adapted to produce a second high frequency time standard signal having a second predetermined frequency determined, at least in part, by the temperature characteristic of the second time standard. Phase detection circuitry for producing a phase detection signal in response to detecting a predetermined difference in phase, between the first and second high frequency time standard signals, is provided. A divider circuit is adapted to produce a low frequency time standard signal and a display is coupled to the divider circuit for displaying actual time in response to the low frequency time signal applied thereto. Frequency adjustment circuitry is coupled intermediate the phase detection circuitry and the divider circuitry for adjusting the frequency of the low frequency time signal produced by the divider means when the phase detection signal is applied thereto.

Accordingly, it is an object of the instant invention to provide an improved highly accurate small-sized electronic wristwatch.

A further of the instant invention is to provide a highly accurate electronic timepiece wherein variations in the timing rate of the timekeeping circuitry are reduced by including an additional piezoelectric vibrator time standard.

Another object of the instant invention is to provide an accurate electronic timepiece formed of first and second piezoelectric vibrator time standards that vary in accordance with changes in temperature when operating at frequencies below mega-Hertz range.

Still a further object of the instant invention is to provide a small-sized high precision electronic timepiece by utilizing relatively inexpensive piezoelectric vibrators formed by chemical photo-etching.

Still a further object of the instant invention is to provide an electronic timepiece having a main vibrator and a secondary vibrator and memory circuitry for controlling the amount of frequency adjustment in response to a predetermined difference in phase between the time standard signals, produced by the respective vibrators.

Still other objects and advantages of the invention will in part by obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
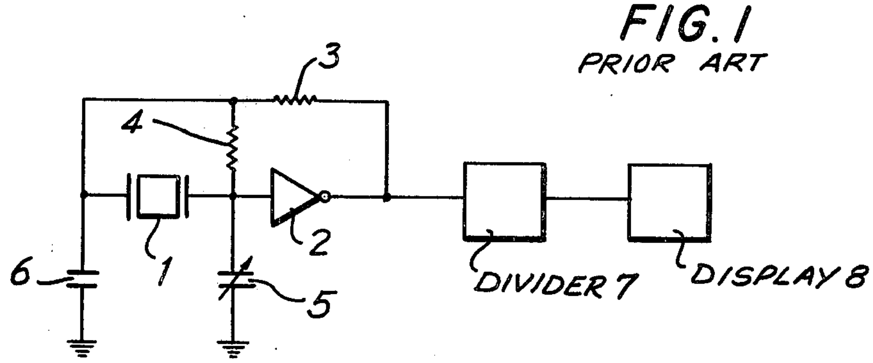
FIG. 1 PRIOR ART
FIG. 1 is a circuit diagram of an electronic timepiece having a piezoelectric vibrator time standard, constructed in accordance with the prior art.

Reference is first made to FIG. 1, wherein an electronic timepiece, constructed in accordance with the prior art, is depicted. The electronic timepiece includes an oscillator circuit including a piezoelectric vibrator 1 as a time standard for permitting the oscillator circuit to produce a high frequency time standard signal. A divider circuit 7 is coupled to the oscillator circuit for dividing down the high frequency time standard signal produced thereby and producing a low frequency time signal. The divider circuitry is usually comprised of a plurality of series-connected divider stages, which divider stages produce a low frequency time signal having a period, such as one second or one minute, that is representative of actual time. A display 8 is coupled to the divider dircuit 7 and in response to receiving the low frequency time signal produced by the divider circuit displays actual time. The display 8 can either be a digital display, formed of seven-segmented liquid crystal or light emitting diode display digits, or, alternatively, the display can be an analog display having clock hands for displaying actual time in response to the low frequency time signal being applied thereto.

The oscillator circuit includes a C-MOS inverter 2 having a gate input terminal coupled to ground through a variable tuning capacitor 5. The gate output terminal of the C-MOS inverter is coupled through a phase control resistor 3 to a biasing feedback resistor 4 coupled in parallel with the piezoelectric vibrator 1. Also coupled to the phase control resistor 3 and parallel coupled feedback resistor 4 and piezoelectric vibrator 1 is a capacitor 6, which capacitor is utilized to stabilize the frequency of the high frequency time standard signal produced by the oscillator circuitry. The frequency of the high frequency time standard signal is tuned by variable capacitor 5.

Because piezoelectric vibrators have temperature characteristics that cause a variation in their frequency of vibration, in response to a change in temperature, capacitors having a temperature characteristic that approximates that of the piezoelectric vibrator, have been utilized in order to compensate for changes in the frequency of vibration of the vibrator caused by its temperature characteristic. it is noted however that capacitors having temperature characteristics that approximate that of the piezoelectric vibrator time standard are not, even in the best case, sufficiently similar to that of the quartz crystal vibrator to guarantee that changes in temperature will not adversely affect the frequency of the high frequency time standard signal produced by the oscillator circuitry. Moreover, if the variation in frequency of the high frequency time standard signal is not compensated for, the low frequency time signal, produced by the divider circuitry, will lose accuracy and, hence, reduce the accuracy of the timepiece. Although piezoelectric vibrators, having a highly accurate temperature characteristic have been provided, these piezoelectric vibrators oscillate at ultra high frequencies, such as in the mega-Hertz range. The higher frequency range increases the power consumption of the timekeeping circuitry and thereby shortens the life of the battery utilized to energize the electronic timepiece circuitry. Moreover, such mega-Hertz piezoelectric vibrators are larger in size, and thereby require considerable space, thereby preventing the electronic timepiece from being sufficiently small-sized as to be utilized as an electronic wristwatch. Accordingly, as is detailed below, the instant invention is characterized by the use of first and second piezoelectric vibrators and, in particular, the respective temperature characteristics thereof in the same electronic timepiece, in order to reduce the effect of changes in temperature on the accuracy of the electronic timepiece.

Figure 2:
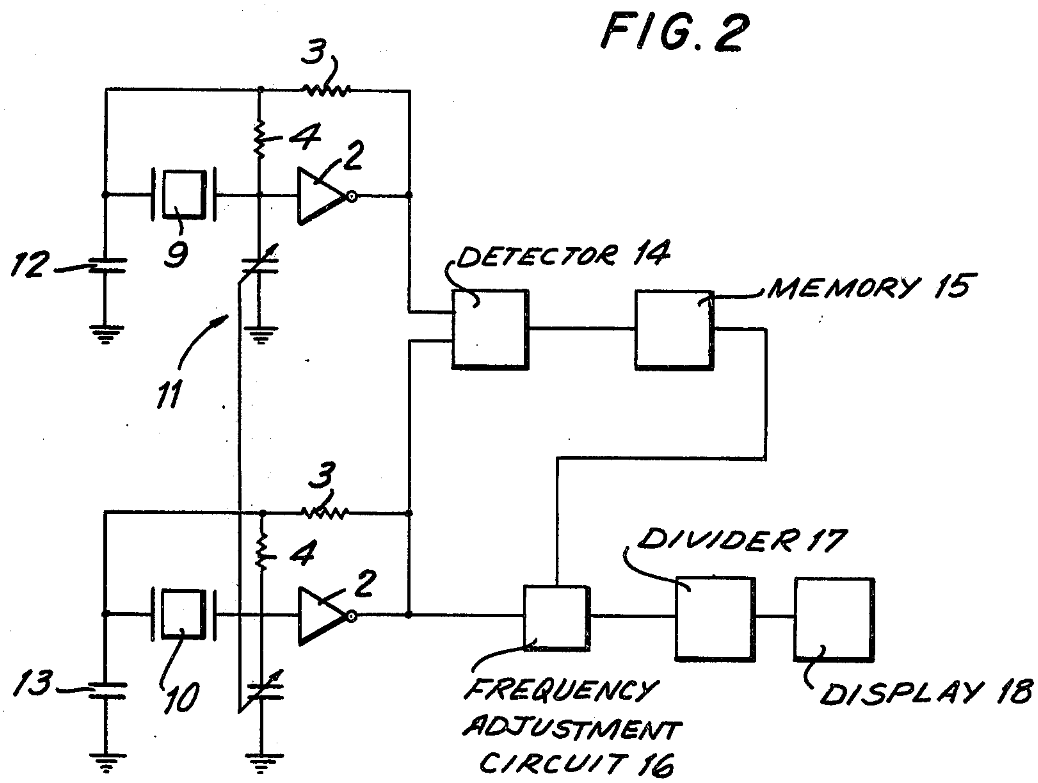
FIG. 2 is a circuit diagram of an electronic timepiece constructed in accordance with a preferred embodiment of the instant invention.

Reference is now made to FIG. 2, wherein an electronic timepiece, including a main oscillator circuit including a first piezoelectric vibrator 10 and a secondary oscillator circuit including a second piezoelectric vibrator 9, is depicted, like reference numerals being utilized to denote like elements depicted above. It is noted that the main oscillator circuit includes a first capacitor 13 which capacitor can be a temperature compensating capacitor of the type discussed above. Similarly, capacitor 12, in the secondary oscillator circuit, can be a temperature compensating capacitor of the type discussed above. Additionally, the variable tuning capacitors of the main oscillator circuit and secondary oscillator circuit are generally indicated as 11, and have a common element for effecting like tuning of both oscillator circuits. A detector 14 is adapted to receive the high frequency time standard signal produced by the main oscillator circuit and the high freuqency time standard signal produced by the secondary oscillator circuit. In light of the different temperature characteristics of the piezoelectric vibrators 10 and 9, the phase detector circuit 14 is adapted to detect a predetermined difference in phase between the first high frequency time standard signal, produced by the main oscillator, and the second high frequency time standard signal, produced by the secondary oscillator, and in response thereto apply a phase detection signal to a memory circuit 15. The memory circuit 15 is coupled to a frequency adjustment circuit 16 for selectively applying the phase detection signal stored in memory 15 to the frequency adjustment circuit to either advance or delay the rate of the high frequency time standard signal applied to the divider circuit 17. Divider circuit 17 is coupled to a display 18 and applies a low frequency time signal thereto. Accordingly, in response to a phase detection signal applied to the frequency adjustment circuit 16, the timing rate (frequency) of the first high frequency time standard signal, produced by the main oscillator circuit, is either advanced or retarded in accordance with the difference in phase detected by the phase detection circuit 14 to thereby render the low frequency time signal, applied to the display 18, more accurate. As is explained in greater detail below, the phase detection circuitry 14 can be coupled directly to the frequency adjustment circuit 16 and the memory eliminated, so that phase adjustment is effected each time the phase detection signal, produced by the detector circuit 14, is applied to the frequency adjustment circuit 16.

Figure 3:
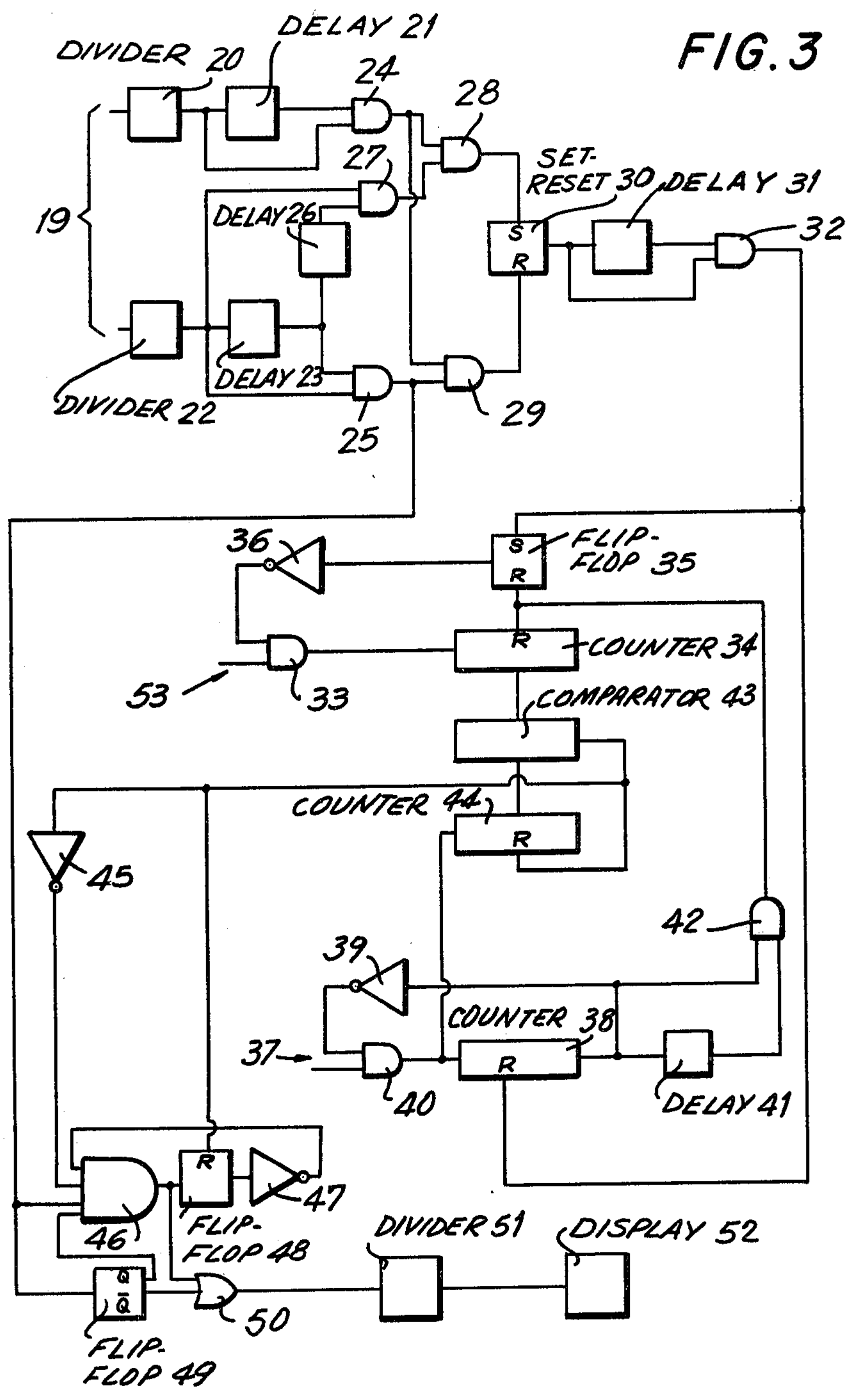
FIG. 3 is a circuit diagram of a memory circuit and phase adjustment circuit for advancing the timing rate of the electronic timepiece circuitry depicted in FIG. 2.

Reference is now made to FIG. 3, wherein a detailed circuit diagram of a memory and frequency advancing adjustment circuit, constructed in accordance with the timepiece circuitry depicted in FIG. 2, is illustrated. The respective input terminals 19 of the divider 22 and divider 20 represent the first high frequency time standard signal and second high frequency time standard signal, respectively produced by the main oscillator circuit and secondary oscillator circuit depicted in FIG. 2. Accordingly, the first high frequency time standard signal is applied to a divider circuit 22, which divider circuit is comprised of several binary flip-flops for dividing down the first high frequency time standard signal and applying same to the first input of an AND gate 27, the input of a shift register delay 23, and the second input of an AND gate 25. The delay 23 and AND gate 25 form a pulse width reduction circuit of the type well known in the art. Specifically, the output of the AND gate 25 is a signal havine the same frequency as the output of the divider 22, with a substantially reduced duty cycle. The output signal from the AND gate 25 is applied to the clock input of a flip-flop 49. As is discussed in greater detail below, the output Q of the flip-flop 49 inverts the output signal of the AND gate 25 and applies same through an OR gate 50 to a divider 51, which divider divides down the output signal from the OR gate 50, and applies, to the display 52, a low frequency time signal of the type discussed above.

The second high frequency time signal produced by the secondary oscillator circuit is applied to a divider 20 formed of the same number of flip-flop stages as the divider 22. The divided down output signal produced by divider 20 is applied to a shift register delay 21, having the same delay characteristic as the delay 23 and, additionally, to the second input of AND gate 24, the delay 21 and AND gate 24 providing the same pulse width reduction as the delay 23 and AND gate 25. Accordingly, the output of the AND gate 24 is applied as a first input to the AND gate 29, and the output of the AND gate 25 is applied as a second input to the AND gate 29, and when a coincident HIGH binary state is applied to AND gate 29, a reset pulse is applied to the reset terminal R of a set-reset flip-flop 30. The output signal of the AND gate 24 is also applied as a first input to the AND gate 28. In order to determine when an output signal is applied to the set terminal S of the set-reset flip-flop 30, by the AND gate 28, the output of the divider 22 is compared with the output signal produced by a one-half cycle delay 26. Specifically, the output of the shaft register delay 23 is also applied to half cycle delay 26 in order to invert the output of the delay 23 by a full half cycle and, thereby, cause the AND gate 27 to produce an output signal when the respective output signal from the delay 26 and divider 22 are at a coincident HIGH binary level. By this arrangement, it is assured that the AND gate 28 will receive coincident HIGH binary level inputs only when the second high frequency time standard signal, produced by the divider 20, is a full half cycle out of phase with the high frequency signal produced by the divider 22. When this condition exists, a HIGH level pulse signal is applied to the set terminal S of the set-reset flip-flop 30 by the AND gate 28 to thereby apply a HIGH binary level signal to a further pulse width reduction circuit comprised of delay 31 and AND gate 32. Accordingly, the output of AND gate 32 is a narrow pulse width phase detection signal representing each time that the secondary output signal, produced by the divider 20, is one-half cycle out of phase with the main output signal, produced by the divider 22.

The phase detection signal, produced at the output of the AND gate 32, is applied to the reset terminal R of a counter 38 and also to the set terminal S of a flip-flop 35. When the HIGH binary level phase detection signal is applied to the reset terminal R of counter 38, counter 38 is reset to a count of zero (0), thereby applying a LOW level input to inverter 39 and, in turn, a HIGH level input to the first input of AND gate 40. A relatively high intermediate frequency signal is applied to the second input of the AND gate 40. The relatively high intermediate frequency signal can be taken from any of the divider circuits in the electronic timepiece, such as from the divider 22, depending upon the frequency rate desired. Accordingly, when the counter 38 is reset to a count of zero, the inverter 39 insures that the high frequency signal is gated to the counter 38 and, additionally, to a further counter 44. The counter 44 begins to count, and the count thereof is applied to a comparator 43, which comparator also receives the count of a counter 34. As explained in detail below, when the counter 44 receives the relatively high frequency signal applied to the AND gate 40, the counter 34 remains clamped at a fixed count. Accordingly, if the comparator 43 detects a coincidence in the count of the counter 44 and counter 34, it, in turn, applies a HIGH binary level pulse to the frequency adjustment circuitry, including flip-flop 48 and inverter 45, which frequency adjustment circuit effects an addition of a pulse to the output signal of the AND gate 25 in a manner discussed in greater detail below.

When the counter 38 is initially reset by the phase detection signal, produced by the AND gate 32, the inverter 39, AND gate 40, in combination with a delay 41 and further AND gate 42, define a timer circuit. After a selected time, counter 38 reaches a predetermined count, and applies a HIGH binary level output to the inverter 39, thereby inhibiting the application of the relatively high frequency signal to the second input of the AND gate 40. At this time, the counter 38 is clamped at a HIGH binary level, and is applied through the pulse width reduction circuitry, including delay 41 and AND gate 42, to effect a resetting of flip-flop 35 and counter 34. When the set-reset flip-flop 35 is reset to zero, the inverter 36, in turn, applies a HIGH binary level signal to a first input of AND gate 33 to gate a relatively low intermediate frequency signal 53 through AND gate 33 to the input of counter 34. It is noted that the relatively low intermediate frequency signal 53 is of a low frequency when compared with the high frequency 37 applied to the AND gate 40, and can, in an exemplary embodiment, be taken from one of the divider stages in the divider 51. Accordingly, when the flip-flop 35 is reset to zero, the counter 34 begins counting and counts until the next phase detection signal is produced at the output of AND gate 32, at which time the count of the counter 34 is clamped to thereby permit counter 34 to define a memory and apply a count to the comparator 43 to be later compared with the count of the counter 44. Therefore, at the time that phase detection signal is applied to the set-reset flip-flop 35 and counter 38, the counter 34 has a fixed count stored therein, and the counter 38 determines whether the comparator 43 will detect a coincidence in the count of the respective counters 34 and 44, or, alternatively, the error introduced by the phase difference will be so small as to render it preferable that no frequency adjustment be effected.

Advancement of the frequency rate is effected each time that a HIGH binary level signal pulse is applied by the comparator 43 to the reset terminal R of flip-flop 48, thereby resetting the flip-flop 48 to zero and, in turn, referencing the output of the inverter 47 to a HIGH binary state. After the comparator 43 produces the HIGH level reset pulse, and applies a reset pulse to counter 44 to thereby reset same to a count of zero, a LOW level signal is applied to inverter 45, which, in turn, references the second input of the AND gate 46 to a HIGH level. The relatively high frequency output signal from the AND gate 25 is applied to the third input of the AND gate, and the Q output of flip-flop 49, which represents the output of the AND gate 25, is also applied to the AND gate 46 as a fourth input thereto. Accordingly, when each of the four inputs to the AND gate 46 are referenced to a HIGH binary state, a HIGH binary pulse is applied to flip-flop 48 to set same to a count of one (1), and, at the same time, is applied to the first input of OR gate 50 in order to add a pulse to the output signal produced at the Q output of flip-flop 49.

By applying the Q output of flip-flop 49, to the second input of AND gate 50, and the Q input of flip-flop 49, to the fourth input of AND gate 46, it is assured that the pulse added to the divided frequency signal, produced by the AND gate 25, is always added during the negative half cycle of second input to the OR gate 50. It is noted that once a HIGH level pulse is applied to the set input of flip-flop 48, the output thereof becomes a HIGH level signal, thereby, in turn, applying a LOW level signal to the first input of the AND gate 46, and preventing any further pulses from being added by OR gate 50 until the next phase detection signal is produced at the output of the AND gate 32. Therefore, by advancing the frequency rate of the intermediate frequency signal applied to the divider 51, the low frequency time signal applied to the display 52 is regulated to thereby provide a more accurate display of time.

It is noted that the phase detection signal 32 can be directly applied to frequency adjustment circuitry to thereby effect the adding of a pulse each time that a phase detection signal is produced. However, by providing the memory circuitry, the sensitivity of the phase adjustment can be sufficiently improved so as to insure that the frequency rate is not advanced when the error between the respective first and second high frequency time standard signals is insufficient to require adjustment of the timing rate of the frequency signals produced by the respective dividers in the electronic timepiece.

In the embodiment illustrated in FIG. 3, the counter 34 is utilized to memorize a period that approximates the primary function of the temperature. It is noted that the number of pulses added equals the number of output pulses produced by the phase detection circuitry (output of AND gate 32) as controlled by the timer circuit and, in particular, the count of the counter 38. Accordingly, the counter 38 defines the secondary function of the temperature, and adjustment of the timing rate is effected for the first and second function of the temperature characteristic. Therefore, by utilizing phase adjustment circuitry of the type illustrated in FIG. 3, piezoelectric vibrators capable of vibrating at midrange frequencies can be utilized and the temperature characteristics thereof readily compensated for. Moreover, if temperature compensating capacitors are utilized in the respective main and secondary oscillator circuits, the circuitry, illustrated in FIG. 3, can be utilized for miniaturizing the differences in the temperature characteristics thereof. It is further noted that a more precise adjustment of the timing rate of the electronic timepiece circuitry can be effected by utilizing a third oscillator circuit and thereby obtaining an adjustment of the timing rate to a tertiary level. Moreover, as aforenoted, if the temperature characteristic of the time standard, included in the main oscillator circuit and secondary oscillator circuit, have a corresponding secondary function, the memory can readily be omitted and the phase detection signal directly applied to the reset input of the inverter 45 and flip-flop 48.

Figure 4:
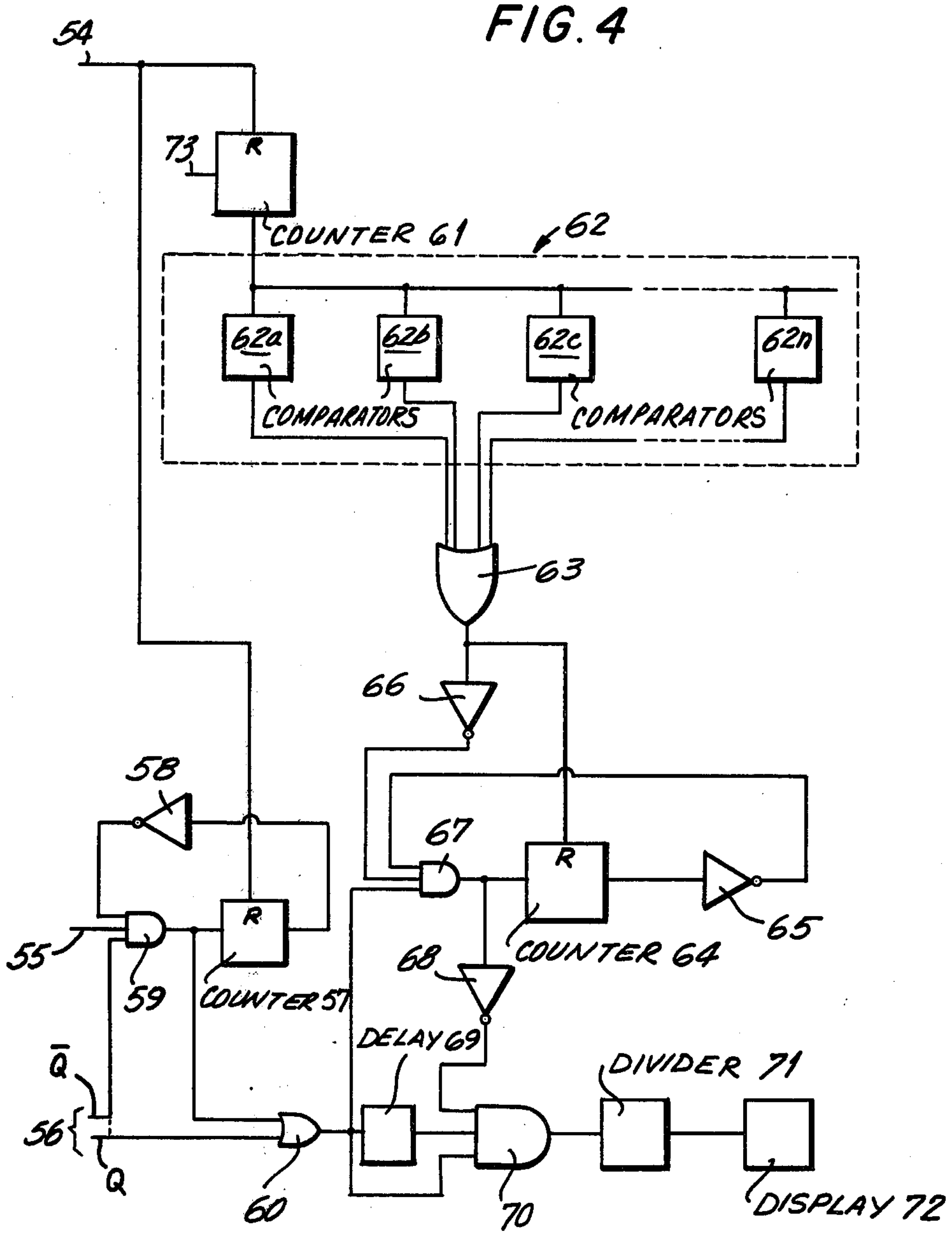
FIG. 4 is a circuit diagram of a programmable memory and phase adjustment circuit for advancing or delaying the frequency rate of the electronic timepiece circuitry depicted in FIG. 2.

Reference is now made to FIG. 4, wherein a programmable memory and a frequency adjustment circuit for advancing or retarding the timing rate of the electronic circuitry, is provided. Phase detection signal 54, which signal is identical to the phase detection signal produced by AND gate 32 in the embodiment illustrated in FIG. 3, is applied to the reset terminal R of a counter 61, and is also applied to the reset input of a counter 57. Signal 55 is identical to the output of the AND gate 25 in the embodiment of FIG. 3, and hence represents the divided down signal produced by the main oscillator circuit. Finally, signal 56 Q and 56 Q are identical to the output of the flip-flop 49 in the embodiment of FIG. 3. Accordingly, the phase detection signal 54 is applied to the reset terminal R of the counter 57 and thereby resets the count thereof to zero, which, in turn, references the output of the inverter 58 to a HIGH level. Therefore, at that time, the first input to AND gate 59 is at a HIGH level. When the counter 57 is reset, and the output Q of flip-flop 49 and the output from the AND gate 25 are in a HIGH binary level, a pulse is applied to the first input of the OR gate 50 and is added to the signal Q, which must be in a negative half cycle, to thereby increase the timing rate in the same manner detailed above with respect to the embodiment depicted in FIG. 3.

Frequency adjustment by retarding the timing rate is effected in the following manner. Counter 61 receives an intermediate frequency signal 73 produced by one of the divider stages in the electronic timepiece circuitry, such as in the divider 71, and is reset in response to phase detection signal 54 being applied to the reset terminal R thereof. A programmable memory 62 includes a plurality of comparators *62a* through *62n* for comparing the count of counter 61 with a predetermined programmed count, and in response to detecting a coincidence between the count of the stages of counter 61 and the comparators *62a* through *62n*, applies a HIGH binary level signal at the output of the OR gate 63, which signal is applied to the reset terminal R of the counter 64. Counter 64 is reset by the HIGH binary level output signal of OR gate 63, and eliminates a pulse from the intermediate frequency signal output of the OR gate 60 in the following manner.

Initially, when counter 64 is reset to zero, inverter 65 references the first input of AND gate 67 to a HIGH binary level. Thereafter, when the output of the OR gate 63 returns to a LOW level, the second input to the AND gate 67 is also referenced to a HIGH level. When the intermediate frequency output signal from OR gate 60 is applied to the third input of AND gate 67 a HIGH level signal is applied to the counter 64, also to effect a setting of same, and is applied to the inverter 68. The application of a binary HIGH level signal to the inverter 68 inhibits the intermediate output signal from OR gate 60. The output signal from OR gate 60 is also applied to the third input of AND gate 70 and to delay 69, which delay, in turn, applies a delay signal to the second input of AND gate 70, thereby insuring that at least one pulse is eliminated. Accordingly, the elimination of the pulse retards the frequency rate of the frequency signal applied to divider 71, and thereby assures that a more accurate low frequency time signal is applied to the display 72 by the divider 71. Therefore, as illustrated in FIG. 4, each time the phase detection signal detects a predetermined phase difference between the frequency rates of the high frequency time standard signals produced by the main oscillator circuit and secondary oscillator circuit, either advancement or retarding of the frequency rate can be effected and the inaccuracy introduced by the temperature characteristics of the respective piezoelectric vibrator is substantially reduced.

It is noted that utilizing tuning capacitors in the respective oscillator circuits, that have a common adjustment, although not essential to the instant invention, can provide an increased correcting function by limiting the correction to changes in temperature. Moreover, the memory circuitry, frequency adjustment circuitry and oscillator circuitry can be formed on the same MOS-IC chips, thereby permitting a low powered small-sized electronic timepiece circuit construction. Also, by permitting piezoelectric vibrators, at mid-range frequencies to be utilized, reduced current consumption and further miniaturization can be effected by the embodiments depicted in FIGS. 3 and 4.

Figure 5:
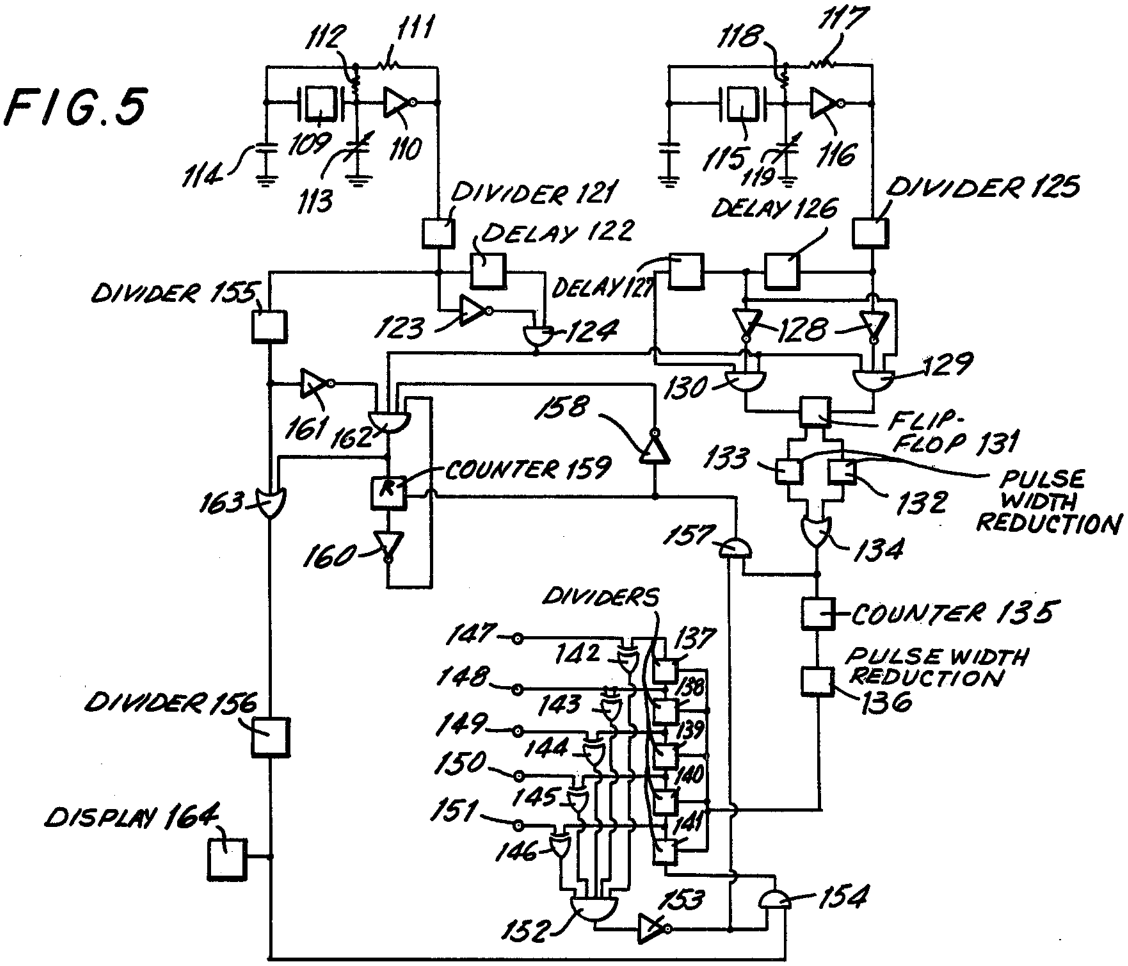
FIG. 5 is a circuit diagram of a programmable memory and frequency adjustment circuit for advancing the frequency rate of the electronic timepiece circuitry depicted in FIG. 2.

Reference is now made to FIG. 5, wherein a further embodiment of the instant invention is depicted. As in the embodiments detailed above, a main oscillator including piezoelectric vibrator 109, inverter 110, phase control resistor 111, feedback resistor 112, temperature compensating capacitor 114 and tuning capacitor 113, and the secondary oscillator circuitry including piezoelectric vibrator 115, bias resistor 118, feedback resistor 117, inverter 116, temperature compensating capacitor 120 and tuning capacitor 119 are identical in structure and operation to their counterpart elements, described in detail above with respect to the prior art embodiment depicted in FIG. 1. The high frequency time standard signal, produced by the main oscillator, is applied to divider 121 and is divided down and applied to delay 122, inverter 123 and inverter 155. Delay 122 is a shift register and, in combination with inverter 123 and AND gate 124, provides an output signal at the output of AND gate 124 that has the same frequency as the output of divider 121 with a substantially reduced pulse width (duty cycle). Similarly, the second high frequency time standard signal produced by the secondary oscillator circuit is applied to divider 125, which divider has the same number of divider stages as the divider 121. The divided down output signal of divider 125 is applied directly to inverter 128 and, also, is applied to a further inverter 128 through a delay circuit 125. Moreover, the output of delay 126 is applied to a further delay 127, which applies its output to an AND gate 130. The output signal from AND gate 124 is also applied as a third input to AND gate 130, and as a first input to AND gate 129. The outputs of AND gates 129 and 130 are respectively connected to a set input and rest input of the flip-flop circuit 31. Pulse width reduction circuits 133 and 132 are coupled to flip-flop 131 and are identical to the pulse width reduction circuits defined by delay 122, inverter 123 and AND gate 124, and function to reduce the duty cycle of the respective input signals applied to OR gate 134. Flip-flop 131 performs the same type of function performed by the set-reset flip-flop 30 in the embodiment illustrated in FIG. 3. Thus, the flip-flop 131 is set to apply a phase detection signal only if the set signal is applied to flip-flop 131 after a reset signal is first applied, or, alternatively, a reset signal is applied after a set signal. Once the proper convention is selected, flip-flop circuit 131 detects a predetermined difference in phase between the first high frequency time standard signal, produced by the main oscillator, and the second high frequency time standard signal, produced by the secondary oscillator, in the same manner described above with respect to the embodiment illustrated in FIG. 3.

Accordingly, a phase difference signal is applied by OR gate 134 to a counter 135 and to a second input of an AND gate 157. When the counter is counted through a full-scale, a reset pulse is applied to each of the dividers 137 through 141 by a pulse width reduction circuit 136. The pulse width reduction circuit 136 is identical to the pulse width reduction circuit detailed above and is provided to assure that the reset pulse, applied to the dividers 137 through 141, is a pulse having a short duty cycle. It is noted that the respective counts of each of the dividers 137 through 141 is compared with a preset count of each of the programming terminals 147 through 151, applied as first input to EXCLUSIVE NOR gates 142 through 146. The other input of the EXCLUSIVE NOR gates is the respective outputs of the dividers 137 through 141. A high level output is produced by AND gate 152 when all of the EXCLUSIVE NOR gates coincidentally apply either a HIGH level or LOW level signal thereto, thus demonstrating a coincidence between the set count of each of the programming terminals 147 through 151 and the dividers 137 through 141.

when the dividers 137 through 141 are reset to a count of zero, in response to a reset pulse produced by counter 135, the output of the AND gate 152 is a LOW level signal, thereby causing the first input of AND gate 154 to be referenced to a HIGH binary state by inverter 153, and further permitting the low frequency time signal 156 to be gated through the second input of AND gate 154 to the respective dividers 137 through 141. Accordingly, the high frequency time standard signal produced by the main oscillator and divided down by the divider 121, divider 155 and the divider 156, and applied to the display 164 as a low frequency time signal, is also applied through AND gate 154 to the dividers 137 through 141.

Moreover, by applying the low frequency time signal to the dividers 137 through 141, when the dividers 137 through 141 are referenced to counts that are coincident with the respective binary states of the programmable terminals 147 through 151, a HIGH level output is produced by AND gate 152, thereby inhibiting the low frequency time signal being applied to the dividers 137 through 141. Accordingly, once the AND gate 154 prevents the low frequency time signal from being applied to dividers 137 through 141, the count thereof remains clamped, thereby permitting same to be utilized as a timer. Therefore, the output signal produced by the pulse width reduction circuit 136 is a trigger signal for the timer circuitry comprised of dividers 137 through 141. Moreover, as is explained in detail below, the terminals 147 through 151 can be set to a programmed count to thereby program the count of the timer defined by the dividers 137 through 141.

As detailed above, when the output of AND gate 152 is referenced to a LOW binary level, the inverter 153 applies a HIGH binary state input to the AND gate 154 to permit the low frequency time signal to be applied therethrough. At the same time, the output of the inverter 153 is applied to a first input of AND gate 157, which AND gate receives as its other input the output of the OR gate 134, and in response to detecting a coincident HIGH binary state of both inputs, applies a reset signal to the counter 159. When counter 159 is reset to a count of zero, inverter 160 references a fourth input of AND gate 162 to a HIGH binary state. Thereafter, when AND gate 157 no longer applies a HIGH binary state signal to reset terminal of counter 159, inverter 158 insures that a third input of AND gate 162 is referenced to a HIGH binary state. A second input of AND gate 162 is coupled to the output of AND gate 124, and, hence, has the pulse width reduced divided down output of divider 121 applied thereto. Additionally, divider 155 applies a divided down output from divider 121 to a first input of AND gate 162 through an inverter 161 thereby assuring that whenever each of the four inputs of AND gate 162 are coincident, and produce a HIGH binary state signal, the binary state signal applied to OR gate 163 is of opposite phase to the output signal from the divider 155 and thus assures that a pulse is added to the pulse rate thereof. Accordingly, the pulse rate of the divided down signal produced by divider 155 is increased before same is applied to divider 156, thereby assuring that the low frequency timing signal applied to the display 164 by the divider 156 is adjusted.

Accordingly, as is illustrated in FIGS. 3, 4 and 5, the phase difference between the high frequency time standard signals produced by the main oscillator circuit and secondary oscillator circuit, as a result of differences caused at least in part by the temperature characteristics of the respective time standards utilized in the main and secondary oscillator circuits, can be adjusted by utilizing a flip-flop (131) as a phase detecting circuit. Moreover, with respect to the embodiment, illustrated in FIG. 5, the number of pulses to be added in response to each detected phase difference is controlled by setting or presetting the terminals of the programmable memory 147 through 151. Therefore, highly precise temperature compensation can be effected. It is noted that instead of utilizing terminals 137 through 141, the fine temperature compensation can also be obtained by programming the counter 135.

Figure 6:
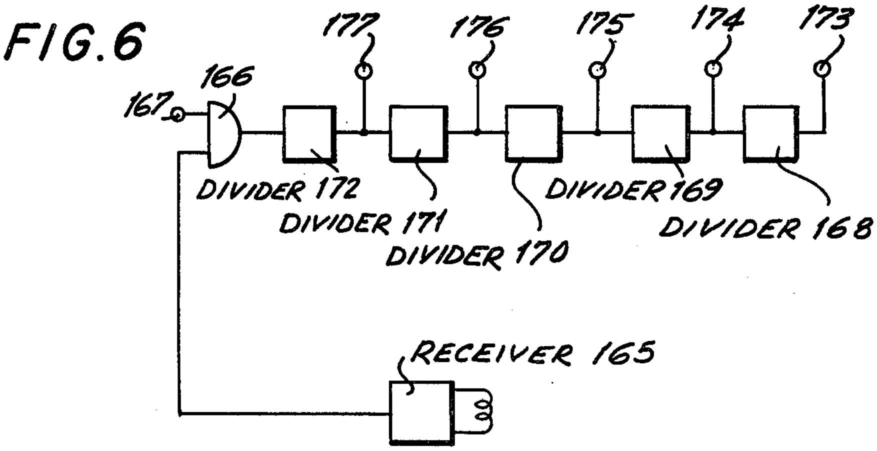
FIG. 6 is a circuit diagram of a programmer for programming the memory depicted in FIG. 5.

Reference is now made to FIG. 6, wherein a programmer for setting each of the terminals 147 through 151 of the programmable memory, illustrated in FIG. 5, is depicted. A receiver 165 is adapted to receive an electomagnetic wave and, in response thereto, control a second input of an AND gate 166. AND gate 166 has, as its other input, a predetermined frequency signal. It is noted that a coil, of the type utilized in a step motor electronic timepiece can be utilized as a receiving coil in order to permit the programmer to receive signals from a transmitter without the electronic wristwatch. The receiver can also be formed of the pulse electrodes of a LCD or LED when a digital display timepiece is provided. Accordingly, when the receiver 165 receives a remote signal, AND gate 166 permits clock pulse 167 to be transmitted to the respective dividers 172 through 168 to thereby set the respective dividers to preset counts. The output terminals 177 through 173 represent preset counts of the dividers 172 thourhg 168 respectively, and can be coupled directly to programmable terminals 147 through 151 in FIG. 5 in order to preset the count thereof.

Accordingly, by utilizing logic circuitry, of the type illustrated in FIGS. 5 and 6, the programmable memory can readily be set or preset by appropriate switches or by the programming circuitry depicted in FIG. 6. Moreover, by utilizing a programmer of the type illustrated in FIG. 6, a magnetic field, electric field, light, electromagnetic wave or audio pulse can be transmitted to a receiver particularly suited to be responsive to same. By such an arrangement, frequency adjustment of the timing rate of the electronic timepiece can be controlled from without the electronic timepiece. It is noted that if a permanent memory is utilized, the amount of frequency adjustment will not be lost when the battery is exchanged, thereby permitting the fixed amount of frequency adjustment to be built into each timepiece at the time of manufacture. Accordingly, the instant invention provides a more accurate timing rate that that obtained solely by the use of temperature compensating capacitors to compensate for the temperature characteristic of the piezoelectric vibrator.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An electronic timepiece comprising in combination a main oscillator means including a first time standard having a first temperature characteristic, said oscillator means being adapted to produce a first high frequency time standard signal having a first predetermined frequency rate determined at least in part by the temperature characteristic of said first time standard, a second oscillator means including a second time standard having a second temperature characteristic, said second oscillator means being adapted to produce a second high frequency time standard signal having a second predetermined frequency determined at least inpart by the temperature characteristic of said second time standard, phase detection means for producing a phase detection signal in response to detecting a predetermined difference in phase between said first high frequency time standard signal and said second high frequency time standard signal, first divider means for producing a low frequency time signal, display means for displaying actual time in response to said low frequency time signal applied thereto, and frequency adjustment means coupled intermediate said phase detection means and said first divider means for adjusting the frequency of said low frequency signal produced by said first divider means in response to said phase detection signal being applied thereto.

2. An electronic timepiece as claimed in claim 1, wherein said frequency adjustment means includes frequency rate advancement means for advancing the frequency of said low frequency time signal produced by said first divider means.

3. An electronic timepiece as claimed in claim 1, wherein said frequency adjustment means includes frequency rate retarding means for retarding the frequency of said low frequency time standard signal produced by said first divider means.

4. An electronic timepiece as claimed in claim 1, wherein said frequency adjustment means includes frequency rate regulation means for advancing and retarding the frequency of said low frequency time signal produced by said first divider means.

5. An electronic timepiece as claimed in claim 1, wherein said phase detection means includes second divider means for receiving at least said first high frequency time standard signal and in response thereto outputting a first intermediate frequency signal, said first divider means being adapted to divide down said first intermediate frequency signal and produce said low frequency time signal in response thereto.

6. An electronic timepiece as claimed in claim 1, wherein said frequency adjustment means is adapted to add at least one pulse to said first intermediate frequency signal in response to said phase detection signal being applied thereto.

7. An electronic timepiece as claimed in claim 6, wherein said frequency adjustment means is adapted to subtract at least one pulse from said first intermediate frequency signal in response to each phase detection signal being applied thereto.

8. An electronic timepiece as claimed in claim 1, and including memory means disposed intermediate said phase detection means and said frequency adjustment means, said memory means being adapted to store a predetermined condition, and in response to detecting a coincidence between said predetermined condition stored therein and said phase detection signal, apply a corrective signal to said frequency adjustment means.

9. An electronic timepiece as claimed in claim 8, wherein said memory means includes a first storage counter means for storing a count representative of said predetermined condition, full-scale counter means for counting through a full-scale count in response to said phase detection signal being applied thereto, and comparator means for detecting coincidence in the count stored in said storage counter means and said full-scale counter means, and in response thereto for applying said corrective signal to said frequency adjustment means and a reset pulse to said full-scale counter to reset the count of same.

10. An electronic timepiece as claimed in claim 9, wherein said full-scale counter means includes timer means for starting said full-scale counter means counting in response to said phase detection signal being applied thereto, said timing means being further adapted to count through a predetermined interval of time, and after said predetermined interval of time, prevent said full-scale counter means from counting, and reset said storage counter means, said storage counter means being adapted to start counting until said phase detection signal is applied thereto, the count of said storage counter means at the time that said phase detection signal is applied thereto being the count representative of said predetermined condition.

11. An electronic timepiece as claimed in claim 8, wherein said memory means includes a full-scale counter means adapted to be counted through a full-scale count, said full-scale counter means being adapted to be reset in response to said phase detection signal being applied thereto, said memory means further including a programmable comparator means adapted to be preset to a predetermined count representative of said predetermined condition, said programmable comparator means being adapted to apply a pulse detection signal to said frequency adjustment means in response to said count of said full-scale counter means being coincident with the predetermined count of said programmable comparator means.

12. An electronic timepiece as claimed in claim 8, wherein said memory means includes a programmable timer means for selectively determining a predetermined interval, said programmable timer means including a gate means for gating said pulse detecting signal to said frequency adjustment means in the absence of said predetermined interval being detected.

13. An electronic timepiece as claimed in claim 12, wherein said timer means includes series-connected divider stages adapted to receive said low frequency timing signal, each of said divider stages being adapted to be reset in response to said phase detection signal being applied thereto, and comparator means coupled to each said divider stage, each of said comparator means having as a first input the signal produced by said divider stage, and as a second input, a programmable terminal, each said comparator means being adapted to produce an output signal in response to the count of said divider stage being coincident with the count of said programmable terminal, and output gate means for applying an output signal when the count of each of said comparators in coincident with the count of each of said divider stages, said output signal being adapted to inhibit the application of said phase detection signal to said frequency adjustment means and to inhibit said low frequency time signal from being applied to said series-connected divider stages.

14. An electronic timepiece as claimed in claim 13, and including programming means, coupled to each of said programmable terminals, said programming means being adapted to preset each of said programmable terminals to a predetermined count.

15. An electronic timepiece as claimed in claim 14, wherein said programming means includes a plurality of series-connected divider stages being adapted to be coupled to said programmable terminals, gating means for selectively gating a clock signal to said series-connected divider stages in response to a gating signal being applied thereto, and receiving means for receiving a control signal from a remote transmitter and in response thereto apply a gating signal to said gating means, the count of said divider stages of said programming means when said control signal is no longer received by said gating means defining the predetermined count of said programmable terminals.

16. An electronic timepiece as claimed in claim 12, and including a counter means disposed intermediate said phase detection means and said timer means for selectively determining a minimum predetermined interval of said timer means.

17. An electronic timepiece as claimed in claim 5, wherein said frequency adjustment means includes a pulse generating means for generating a pulse in response to said phase detection signal being applied thereto, and first gate means for adding said pulse to said first intermediate signal to thereby advance the timing rate thereof.

18. An electronic timepiece as claimed in claim 17, wherein said pulse generating means include flip-flop means adapted to be reset in response to said phase detection signal being applied thereto, and further gate means for detecting when said flip-flop means is reset and in response thereto for transmitting the next pulse of said first intermediate frequency signal, said second gating means being adapted to apply said pulse to said first gating means in order to add same to said first intermediate frequency signal, said second gating means being also adapted to apply said pulse to said flip-flop means to set same and prevent said second gate means from applying any further pulses of said intermediate frequency signal to said first gate means.

19. An electronic timepiece as claimed in claim 8, wherein said phase adjustment means includes inhibit circuit means coupled to said memory means for producing an inhibit pulse in response to said predetermined condition of said memory being compared to said phase detection signal, and inhibit gate means adapted to receive said first intermediate frequency signal and said inhibit pulse and in response thereto, inhibit at least one pulse of said first intermediate frequency signal and thereby retard the timing rate thereof.

20. An electronic timepiece as claimed in claim 1, wherein said first and second oscillator means both include at least one tuning capacitor means commonly coupled to each other to effect a common variation of the frequencies of the respective high frequency time standard signals produced thereby.

21. An electronic timepiece as claimed in claim 20, wherein said first and second oscillator means both include temperature compensating capacitor means, both of said temperature compensating capacitor means having respective predetermined temperature characteristics.

* * * * *